United States Patent [19]

Adams

[11] Patent Number: 4,768,073
[45] Date of Patent: Aug. 30, 1988

[54] TESTING INTEGRATED CIRCUITS

[75] Inventor: Garry R. Adams, Great Dunmow, Great Britain

[73] Assignee: ITT Gallium Arsenide Technology Center, A Division of ITT Corporation, Roanoke, Va.

[21] Appl. No.: 880,406

[22] Filed: Jun. 30, 1986

[30] Foreign Application Priority Data

Jul. 5, 1985 [GB] United Kingdom ............... 8517087

[51] Int. Cl.⁴ ................ H01L 27/14; H01L 31/12; H01L 27/02
[52] U.S. Cl. .................................. 357/30; 357/19; 357/32; 357/40; 357/45; 372/50
[58] Field of Search ............ 357/30 G, 30 H, 30 M, 357/19, 40, 32, 45; 372/50, 8

[56] References Cited

U.S. PATENT DOCUMENTS 4,297,653 10/1981 Scifres et al. ................ 372/50

Primary Examiner—William L. Sikes
Assistant Examiner—Georgia Y. Epps
Attorney, Agent, or Firm—Robert A. Walsh; Thomas N. Twomey; Mary C. Werner

[57] ABSTRACT

Integrated circuits are tested prior to separation from a processed wafer. Each circuit has photoreceivers coupled via metallization tracks to an adjacent circuit. The receivers are used for the input of high speed optical test signals. The intercircuit coupling tracks are severed when the wafer is scribed to separate the individual circuits thus removing the electrical parasitic effects of the receivers.

8 Claims, 2 Drawing Sheets

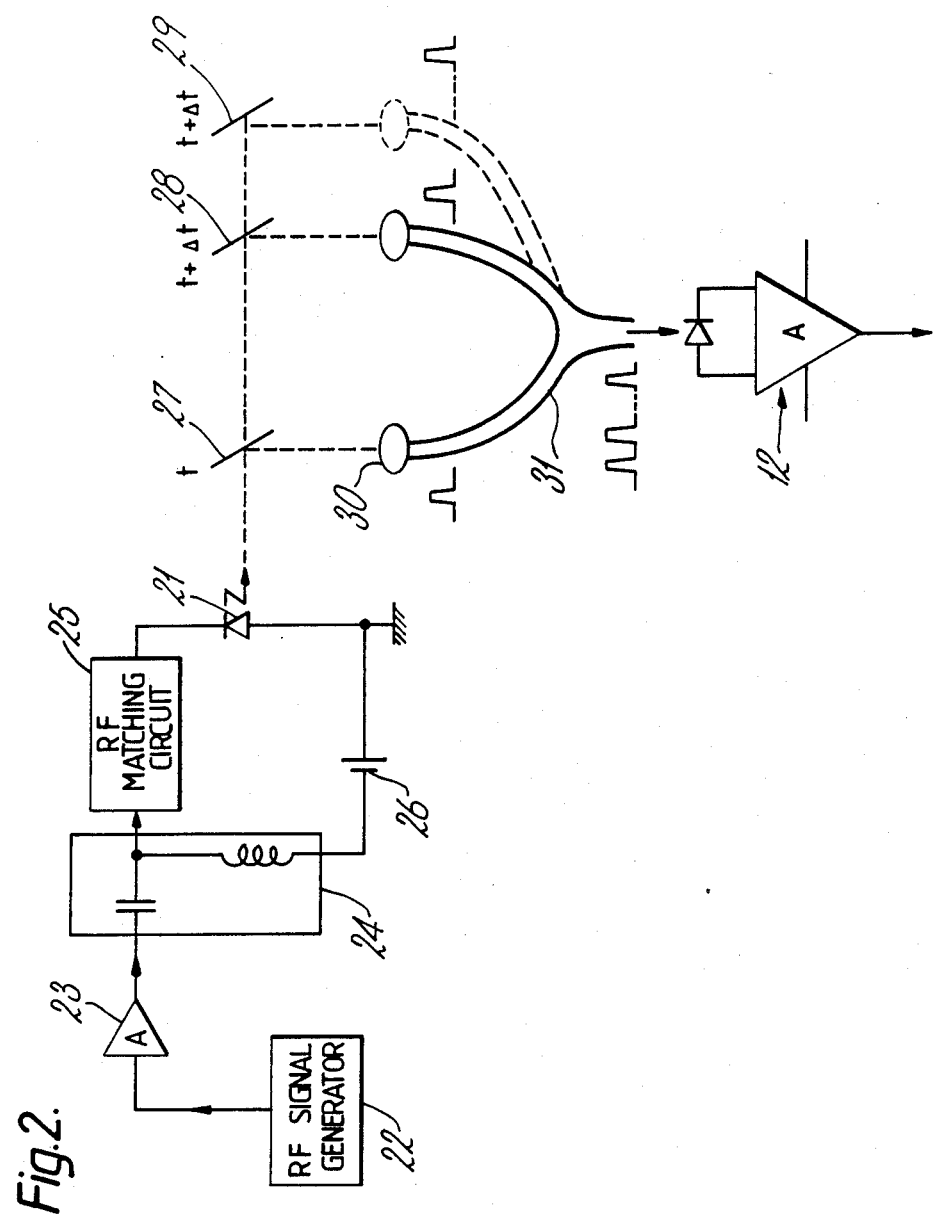

TESTING INTEGRATED CIRCUITS

FIELD OF THE INVENTION

This invention relates to methods of testing integrated circuits and to integrated circuits adapted for testing by these methods.

BACKGROUND AND SUMMARY OF THE INVENTION

As the operating speed of integrated circuits becomes faster it is becoming increasingly difficult to test such circuits using conventional electronic techniques. It is particularly difficult to test complex high speed digital circuits 'on slice', i.e. before the circuits have been separated by scribing and dicing the wafer. At present custom-made probe cards are used to provide electrical connection to an individual circuit via metal probes which are placed on the circuit bondpads. This method is unsatisfactory for two principle reasons. Firstly the characteristic impedance of the probe cannot be kept low enough to match into the integrated circuit. This is due primarily to parasitic capacitance. Secondly, electrical breakthrough from the input probe to the output probe can cause severe distortion of test waveforms resulting in somewhat uncertain test results.

Furthermore it is difficult to generate by purely electronic techniques programmable digital bit patterns or words of precise pulse widths and pulse spacings at clock rates greater than 1 gigabit/sec.

The object of the invention is to minimise or to overcome these disadvantages.

According to one aspect of the invention there is provided a processed semiconductor wafer including an array of integrated circuits each of which incorporates one or more photoreceivers whereby input light signals may be coupled to an adjacent circuit of the array.

According to another aspect of the invention there is provided a method of testing individual integrated circuits prior to separation by dicing from a processed wafer, the method including providing on each said circuit one or more photodetectors the outputs of which are coupled to an adjacent circuit of the array, applying an optical test code to the photodetectors, and monitoring the response of each said circuit on the test code.

The technique is particularly suitable for use with high speed digital circuits fabricated in gallium arsenide as it is fully compatible with gallium arsenide processing methods.

BRIEF DESCRIPTION OF THE DRAWINGS

An embodiment of the invention will now be described with reference to the accompanying drawing in which:

FIG. 2 is a schematic diagram of an apparatus for generating optical test signals for use with the wafer of FIG. 1.

DESCRIPTION OF THE PREFERRED EMBODIMENTS

Figure 1:
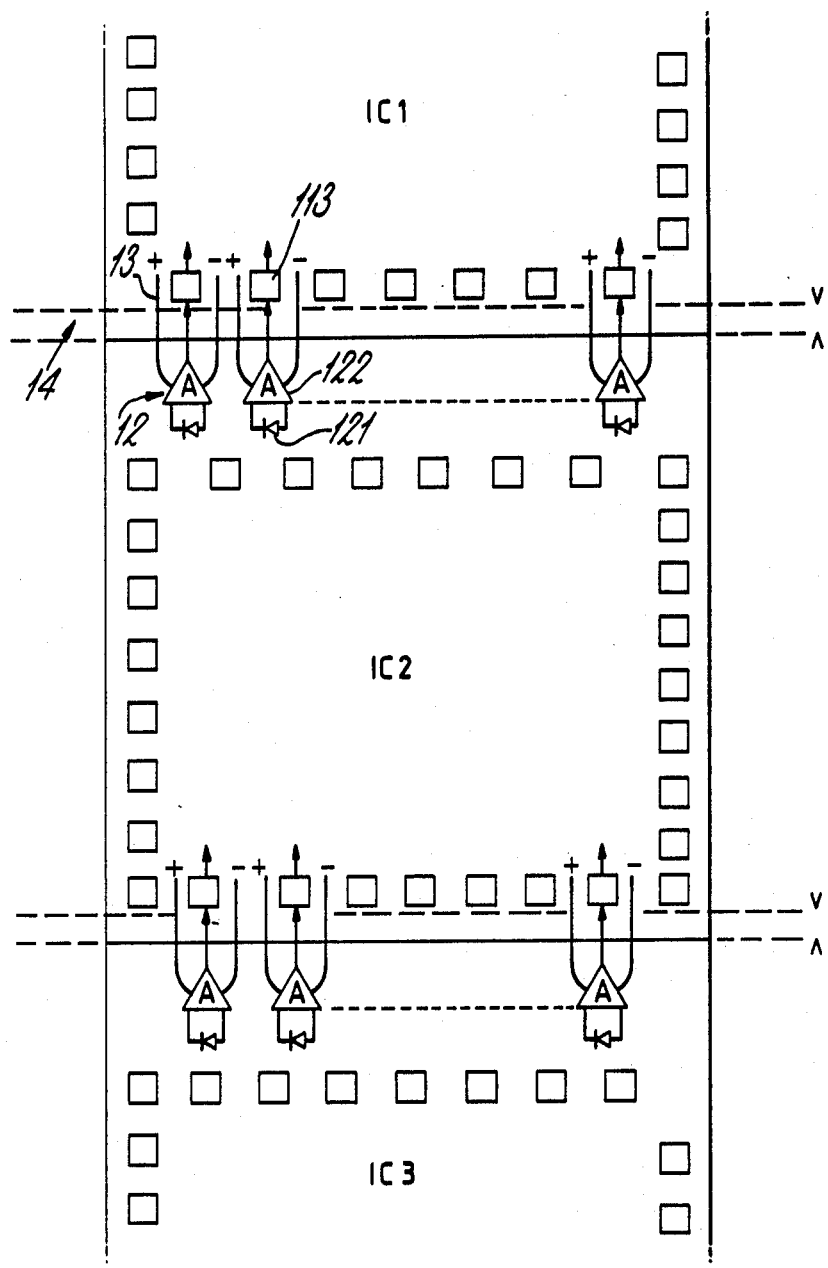
FIG. 1 is a schematic view of a portion of a wafer incorporating a plurality of integrated circuits, provided with means for the application of optical test signals.

Referring to FIG. 1, the processed semiconductor wafer, e.g. of gallium arsenide, comprises an array of similar integrated circuits IC1, IC2, IC3. Each circuit has a plurality of bond pads 11 for subsequent connection to the circuit when that circuit is removed from the wafer and package. Some of the bond pads, e.g. 112, 113 are used as input terminals for the input of signals to the circuit. These terminals are also employed as test terminals for the input of test signals to the circuit. Wide band photoreceivers 12 are fabricated on each circuit (e.g. IC2) adjacent the bond pads of that circuit and are coupled via metallisation tracks 13 to the electrical input bond pads 112, 113 of the adjacent circuit (IC1). Each photoreceiver 12 comprises a photodetector 121 and an associated amplifier 122. Power supplies for the photoreceivers (121, 122) on IC2 may be provided via metallisation tracks from IC1. The tracks 13 cross a scribe channel 14, typically 100 microns in width, so that, when the circuits are separated by scribing and dicing of the wafer, the interconnection between adjacent circuits is broken. By severing the interconnection the photoreceivers are disabled and they thus have no parasitic effect on the subsequent operation of the integrated circuit.

Instead of conventional on-slice testing in which metal probes are used to apply test signals to the chips via the test bond pads 112, 113 these signals are coupled optically to the photoreceivers via an array of optical fibres (not shown). These optical fibres may be positioned with sufficient accuracy by mounting on a probe card alongside metal guides. Test data streams in the multigigabit/sec. range may be coupled to the chip in this manner. The principle speed limitations are those of generation and photodetection, both of which have been demonstrated to exceed 5 GHz.

The arrangement of the photoreceivers on the wafer ensures that, after scribing, the photoreceivers are fully isolated from the digital circuits and will thus not adversely affect either power consumption or capacitance.

High speed data words of the type required for functional verfication of complex GaAs logic ICs may be generated optically by using the arrangement as shown in FIG. 2. In this arrangement very narrow (e.g. 50 ps) pulses are generated by biassing a semiconductor laser 21 just below its lasing threshold and then driving it with a high power radio frequency signal from a generator 22 and amplifier 23. The amplifier output is fed to the layer 21 via a two input bias tree network 24 and a matching circuit 25. The other input of the network 24 is driven by a bias source 26. The narrow pulses are produced at the peak of each r.f. cycle and thus the waveform generated is a train of narrow optical pulses with a period equal to the r.f. signal frequency. Typically the narrow pulses are passed through an arrangement of beam splitters 27, 28, 29 which are spaced by distances such that the time taken for an optical pulse to travel from one to the next is $\Delta t$ ps. The output from each beam splitter is focussed via a lens 30 into a matching input of a multi input fibre optic combiner 31 whereby the optical signal is directed to a photoreceiver 12. The output of the combiner 31 is a stream of optical words, with the word rate governed by the r.f. signal driving the laser. Each word is made up from narrow pulses with spacing between pulses of $\Delta t$ ps. If all beam splitter outputs are used, a stream on 'ones' results. 'Zeros' may be inserted into the word by blanking the appropriate input to the fibre combiner. These high data rate optical words are fed to the chip under test via the photoreceivers. Typically the laser wavelength is 0.81 microns.

The technique is based upon the application of digital test pulses to the input connections of digital integrated circuits in the form of pulses of light energy rather than electrical energy. This energy is then converted to electrical energy, through photodetection, on the integrated circuit to be tested. A convenient method of photodetection on GaAs substrates is the use of a pair of interdigitated electrodes which form an interdigitated photodetector. When bias is applied across the electrodes, which are formed of Schottky barrier metal (e.g. Au or Al) deposited directly upon the GaAs SI substrate material, photogenerated hole—electron currents flow under the influence of the bias field. These carriers are collected on the appropriate electrode. Detectors of this type have been shown to respond to modulation frequencies of up to 18 GHz. They are sensitive to optical photons with energy greater than the material bandgap, i.e. $\lambda$ of <0.9 nm.

Following photodetection amplification is required in order that digital logic level swings may be generated from relatively low power optical pulses, i.e. 1 mW say, which can be easily generated from a semiconductor laser. The output of the combined photodetector-amplifier is then connected by integrated circuit track metal to an input bond pad. This bond pad is the one through which electrical signals will pass when the chip is scribed up and for which the optically generated signals are a substitute.

The pulse modulated light may be fed to the photodetector as a focussed space beam or via an optical fibre. The latter method is preferred since an optical fibre can easily replace an electrical probe on a test probe card, making alignment of light and detector a simple matter.

The technique is particularly suitable for use with gallium arsenide circuits as the interdigitated photodetectors and wideband amplifiers are fully compatible with GaAs digital IC processing. That is, they can be fabricated at the same time, with the same process steps and under the same conditions as are essential for GaAs digital ICs. This means that GaAs digital ICs can be designed with provision for both optical and electrical data inputs, the former for on slice tests and the latter for standard connection.

A further use of the technique is the reduction of "clock skew" between several integrated circuits driven by the same clock waveform. In high speed circuits, and high speed circuit arrays, electrical capacitance effects can delay clock signals to one chip (or part of a chip) with respect to other chips (or parts of a chip) causing timing slippage and, at sufficiently high clock rates, causing errors. This phenomenon is known as "clock skew". Clock skew can be overcome by broadcasting the clock waveform on an optical carrier to a photoreceiver on each and every relevant chip (or parts of chips). Thus, in this case, electrical connection of clock circuits is avoided.

I claim:

1. A processed semiconductor wafer including an array of integrated circuits, said array comprising a first integrated circuit and a second integrated circuit adjacent said first integrated circuit on said wafer each of which first and second integrated circuits incorporates one or more photoreceivers and means whereby input signals to said first integrated circuit may be coupled from said first integrated circuit to said second integrated circuit of the array.

2. A wafer as claimed in claim 1, wherein a power supply for one of said photoreceivers incorporated on said first integrated circuit is disposed on an integrated circuit adjacent said first integrated circuit and is coupled to said one of said photoreceivers via a metallisation track.

3. A wafer as claimed in claim 1 wherein each said integrated circuit comprises a signal input and a photoreceiver and wherein said photoreceiver on each said integrated circuit is coupled to a signal input of another integrated circuit.

4. A wafer as claimed in claim 3, wherein coupling between each said photodetector and another integrated circuit is effected across a scribe channel whereby the coupling may be disabled upon separation of said integrated circuits from said wafer.

5. An integrated circuit diced from a processed wafer as claimed in claim 1.

6. A method of testing individual integrated circuits prior to separation by dicing from a processed wafer on which each integrated circuit is adjacent at least one other integrated circuit, the method including providing on each said integrated circuit at least one photodetector the output of which is coupled to a signal input of another integrated circuit adjacent said integrated circuit of the array, applying an optical test code to the photodetector, and monitoring the response of said adjacent integrated circuit to the test code.

7. A method as claimed in claim 6, wherein said optical code is derived from a radiofrequency signal coupled to a semiconductor laser biased to a level immediately below its lasing threshold.

8. A method as claimed in claim 7, wherein said optical code comprises optical words formed from a combination of delayed signals from the laser.

* * * * *